US009146293B2

(12) United States Patent
Wang et al.

(10) Patent No.: US 9,146,293 B2
(45) Date of Patent: Sep. 29, 2015

(54) METHODS AND APPARATUS FOR ACCURATE CHARACTERIZATION OF SIGNAL COIL RECEIVER SENSITIVITY IN MAGNETIC RESONANCE IMAGING (MRI)

(71) Applicant: OHIO STATE INNOVATION FOUNDATION, Columbus, OH (US)

(72) Inventors: Jinghua Wang, Columbus, OH (US); Zhong-Lin Lu, Dublin, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 220 days.

(21) Appl. No.: 13/778,226

(22) Filed: Feb. 27, 2013

(65) Prior Publication Data

US 2013/0251227 A1 Sep. 26, 2013

Related U.S. Application Data (60) Provisional application No. 61/603,542, filed on Feb. 27, 2012, provisional application No. 61/691,040, filed on Aug. 20, 2012.

(51) Int. Cl.
*G06K 9/00* (2006.01)
*G01R 35/00* (2006.01)
(Continued)

(52) U.S. Cl.
CPC .............. *G01R 35/00* (2013.01); *G01R 33/246* (2013.01); *G01R 33/44* (2013.01); *G06T 7/00* (2013.01); *G01R 33/5611* (2013.01); *G01R 33/5612* (2013.01); *G01R 33/5659* (2013.01)

(58) Field of Classification Search
CPC ........... G01R 33/5611; G01R 33/3415; G01R 33/561; G01R 33/5659; G01R 33/246; G01R 33/4824; G01R 33/5619; G01R 33/56375; G01R 33/56509; G01R 33/3453; G01R 33/5617; G01R 33/281; G01R 33/341; G01R 33/4833; G01R 33/4836; G01R 33/5615; G01R 33/563
See application file for complete search history.

(56) References Cited

U.S. PATENT DOCUMENTS 4,887,039 A 12/1989 Roemer et al.
4,983,921 A 1/1991 Kramer et al.
(Continued)

FOREIGN PATENT DOCUMENTS

WO WO 2012/001583 1/2012
WO WO 2012/023098 2/2012

OTHER PUBLICATIONS

Ances, B. M., Leontiev, O., Perthen, J. E. et al., Regional differences in the coupling of cerebral blood flow and oxygen metabolism changes in response to activation: Implications for BOLD-fMRI, NeuroImage, 39:1510 (2008).

(Continued)

*Primary Examiner* — Tom Y Lu
(74) *Attorney, Agent, or Firm* — Meunier Carlin & Curfman LLC (57) ABSTRACT A method for estimating receiver coil sensitivity in a magnetic resonance (MR) system having a plurality of coils in a coil array including a reference coil, including steps of estimating receiver coil sensitivity in each of the plurality of coils in the coil array of the MR system using one of an electromagnetic field method, a bias field method, and a uniform transmit field method. Each of the plurality of coils in the coil array includes one or more of a surface coil, a volume coil, a set of coil arrays, or an antenna element of a coil array. The method further includes steps of obtaining a reference image using the reference coil; generating a measured sensitivity map using the reference coil; and for each of the plurality of coils of the coil array, calculating a receiver coil sensitivity map.

21 Claims, 6 Drawing Sheets (51) Int. Cl.
| | |
|---|---|
| *G01R 33/44* | (2006.01) |
| *G06T 7/00* | (2006.01) |
| *G01R 33/24* | (2006.01) |
| *G01R 33/561* | (2006.01) |
| *G01R 33/565* | (2006.01) |

(56) References Cited

U.S. PATENT DOCUMENTS

| | | | |
|---|---|---|---|
| 5,017,872 A | 5/1991 | Foo et al. | |
| 6,326,786 B1 | 12/2001 | Pruessmann et al. | |
| 6,559,642 B2 | 5/2003 | King | |
| 6,697,661 B2 | 2/2004 | Raghavan et al. | |
| 6,704,594 B1* | 3/2004 | Blank et al. | 600/423 |
| 6,949,928 B2 | 9/2005 | Gonzalez Ballester et al. | |
| 6,965,232 B2 | 11/2005 | Sodickson et al. | |
| 7,227,359 B2* | 6/2007 | Ma | 324/309 |
| 7,254,435 B2 | 8/2007 | Zhang et al. | |
| 7,330,575 B2 | 2/2008 | Fuderer | |
| 7,358,731 B2 | 4/2008 | Fuderer et al. | |
| 7,375,523 B1 | 5/2008 | Hancu | |
| 7,777,487 B2 | 8/2010 | Ying et al. | |
| 7,952,351 B2 | 5/2011 | King et al. | |
| 8,055,037 B2 | 11/2011 | Sinop et al. | |
| 8,076,938 B2 | 12/2011 | Brau et al. | |
| 2006/0261809 A1 | 11/2006 | Fuderer et al. | |
| 2007/0182410 A1 | 8/2007 | Niemi et al. | |
| 2009/0278536 A1 | 11/2009 | Winkelmann et al. | |
| 2011/0148410 A1* | 6/2011 | Zaitsev et al. | 324/309 |

OTHER PUBLICATIONS

Ashburner, J., Friston, K. J., "Unified segmentation" NeuroImage, 26:839-851 (2005).
Balezeau, F., Eliat, P. A., Cayamo, A. B., Saint-Jalmes, H., Mapping of low flip angles in magnetic resonance, Phys Med Biol., 56:6635-47 (2011).
Belaroussi, B., Milles, J., Carme, S., Zhu, Y. M., Benoit-Cattin, H., Intensity non-uniformity correction in MRI: existing methods and their validation, Med Image Anal., 10:234-46 (2006).
Breuer, F. A., Kellman, P., Griswold, M. A., Jakob, P. M., Dynamic autocalibrated parallel imaging using temporal GRAPPA (TGRAPPA) Magn Reson Med., 53:981-985 (2005).
Brunner, D. O., Pruessmann, K. P., "B1+ Interferometry for the Calibration of RF Transmitter Arrays" Magn Reson Med., 61:1480-1488 (2009).
Chung, S., Kim, D, Breton, E., Axel, L., "Rapid B1+ Mapping Using a Preconditioning RF Pulse with TurboFLASH Readout" Magn Reson Med., 64:439-446 (2010).
Collins, C. M., Yang, Q.X., Wang, J., Zhang, X., Liu, H., Michaeli, S., Zhu, X. H., Adriany, G., Vaughan, J. T., Anderson, P., Merkle, H., Ugurbil, K., Smith, M. B., Chen, W., "Different Excitation and Reception Distributions With a Sinlge-Loop Transmit-Receive Surface Coil Near a Head-Sized Spherical Phantom at 300 MHz" Magn Reson Med., 47:1026-1028 (2002).
Cunningham, C. H., Pauly, J. M., Nayak, K. S., "Saturated Double-Angle Method for Rapid B1+ Mapping" Magn Reson Med., 55:1326-1333 (2006).
Dai, W., Robson, P. M., Shankaranarayanan, A., Alsop, D. C., Sensitivity calibration with a uniform magnetization image to improve arterial spin labeling perfusion quantification, Magn Reson Med., 66:1590-600 (2011).
Dowell, N. G., Tofts, P. S., "Fast, Accurate, and Precise Mapping of the RF Field in Vivo Using the 180° Siganl Null" Magn Reson Med., 58:622 (2007).
Glover, G. H., Hayes, C. E., Helc, N. J., Edelstein, W. A., Mueller, O. M, Hart, H. R., Hardy, C. J., Donnell, M. O., Barber, W. D., Comparison of linear and circular polarization for magnetic resonance imaging, J Magn Reson., 1985, 64:255-270.
Griswold, M. A., Breuer, F., Blaimer, M., Kannengiesser, S., Heidemann, R. M., Mueller, M., Nittka, M., Jellus, V., Kiefer, B., Jakob, P. M., Autocalibrated coil sensitivity estimation for parallel imaging, NMR Biomed., 19:316-324 (2006).
Heinzer-Schweizer, S., De Zanche, N., Pavan, M., Mens, G., Sturzenegger, U., Henning, A., Boesiger, P., "In-vivo assessment of tissue metabolite levels using 1H MRS and the Electric Reference to access In vivo Concentrations (ERETIC) method" NMR in Biomedicine, 23:406 (2010).
Hoge, W. S., Brooks, D. H., Using GRAPPA to improve autocalibrated coil sensitivity estimation for the SENSE family of parallel imaging reconstruction algorithms, Magn Reson Med., 2008, 60:462-7.
Hoult, D. I., Richards, R. E., The signal-to-noise ratio of the nuclear magnetic resonance experiment, J. Magn. Reson.; 24:71-85 (1976).
Hoult, D. I., "The Principle of Reciprocity in Signal Strenght Calculations—A Mathematical Guide" Concepts Magn Reson., 12:173 (2000).
Insko, E. K., Bolinger, L., "Mapping of the Radiofrequency Field" J. Magn. Reson. Series A., 103:82-85 (1993).
Jiru, F., Klose, U., "Fast 3D Radiofrequency Field Mapping Using Echo-Planar Imaging" Magn Reson Med., 56:1375-1379 (2006).
Kunz, K. S., Luebbers, R. J., "The Finite Difference Time Domain Method for Electromagnetics" (1993) pp. 11-27, 359-637, 391-433.
Mao, W., Smith, M. B., Collins, "Exploring the Limits of RF Shimming for High-Field MRI of Human Head" C. M., Magn Reson Med., 56:918 (2006).
McKenzie, C. A., Yeh, E. N., Ohliger, M. A., Price, M. D., Sodickson, D. K., Self-calibrating parallel imaging with automatic coil sensitivity extraction, Magn Reson Med., 47:529-38 (2002).
Morrell, G. R., "A Phase-Sensitive Method of Flip Angle Mapping" Magn Reson Med., 60:889-894 (2008).
Moyher, S. E., Vigneron, D. B., Nelson, S. J., Surface coil MR imaging of the human brain with an analytic reception profile correction, J Magn Reson Imaging, 1995, 5:139-44.
Ouwerkerk, R., Weiss, R. G., Bottomley, P. A., Measuring human cardiac tissue sodium concentrations using surface coils, adiabatic excitation, and twisted projection imaging with minimal T2 losses, J Magn Reson Imaging, 21:546-55 (2005).
Pruessmann, K. P., Weiger, M., Scheidegger, M. B., Boesiger, P., SENSE: sensitivity encoding for fast MRI, Magn Reson Med., 42:952-62 (1999).
Sacolick, L. I., Wiesinger, F., Hancu, I., Vogel, N. W., B1 mapping by Bloch-Siegert shift. Magn Reson Med., 63:1315-1322 (2010).
Sheng, J., Wiener, E., Liu, B., Boada, F., Ying, L., Improved self-calibrated spiral parallel imaging using JSENSE, Med Eng Phys., 2009, 31:510-4.
Sled, J. G., Zijdenbos, A. P., Evans, A. C., "A Nonparametric Method for Automatic Correction of Intensity Nonuniformity in MRI Data" IEEE Trans Med Imaging, 17:87-97 (1998).
Sled, J. G., Pike, G. B., Standing-wave and RF penetration artifacts caused by elliptic geometry: an electrodynamic analysis of MRI, IEEE Trans Med Imaging, 17:653-662 (1998).
Vovk, U., Pernus, F., Likar, B. A., Review of methods for correction of intensity inhomogeneity in MRI, IEEE Trans Med Imaging, 26:405-21 (2007).
Wang, J., Qiu, M., Constable, R. T., In vivo method for correcting transmit/receive nonuniformities with phased array coils, Magn. Reson. Med. 53 666-74 (2005).
Wang, J., Qiu, M., Yang, Q. X., Smith, M. B., Constable, R. T., Measurement and correction of transmitter and receiver induced nonuniformities in vivo, Magn. Reson. Med., 53:408-17 (2005).
Wang, J., Watzl, J., Qiu, M., de Graaf, R. A., Constable, R. T., "In vivo Receive Sensitivity Measurement" Proc. ISMRM Seventeenth Annual meeting, Hawaii, USA, (2009) p. 4564.
Wang, J., Yang, Q. X., Zhang, X., Collins, C. M., Smith, M. B., Zhu, X. H., Adriany, G., Ugurbil, K., Chen, W., Polarization of the RF field in a human head at high field: a study with a quadrature surface coil at 7.0 T., Magn Reson Med., 48:362-369 (2002).
Watanabe, H., Takaya, N., Mitsumori, F.,"Non-uniformity correction of human brain imaging at high field by RF field mapping of B1+ and B1−" J Magn Reson., 212:426-30 (2011).
Yang, C., Deng, W., Stenger, V. A., Simple Analytical Dual-Band Spectral-Spatial RF Pulses for B1+ and Susceptibility Artifac reduction in Gradient Echo MRI, Magn Reson Med., 65:370-376 (2011).

(56) References Cited

OTHER PUBLICATIONS

Yang, Q. X., Wang, J. Zhang, X., Collins, C. M., Smith, M. B., Liu, H., Zhu, X. H., Vaughan, J. T., Ugurbil, K., Chen, W., Analysis of wave behavior in lossy dielectric samples at high field, Magn Reson Med., 2002, 47:982-9.

Yang, Q. X., Mao, W., Wang, J., Smith, M. B., Lei, H., Zhang, X., Ugurbil, K., Chen, W., Manipulation of image intensity distribution at 7.0 T: passive RF shimming and focusing with dielectric materials, J Magn Reson Imaging, 24:197-202 (2006).

Yarnykh, V. L., "Actual Flip-Angle Imaging in the Pulsed Steady State: A Method for Rapid Three-Dimensional Mapping of the Transmitted Radiofrequency Field" Magn Reson Med., 57:192-200 (2007).

Yee, K. S., Numerical solution of initial boundary value problems involving Maxwell's equations in isotropic media, IEEE Trans Ant Propag, 14:302-307 (1966).

Zhang, Y., Brady, M., Smith, S., "Segmentation of Brain MR Images Through a Hidden Markov Random Field Model and the Expectation-Maximization Algorithm" IEEE Trans. On Medical Imaging, 20:45-57 (2001).

* cited by examiner

METHODS AND APPARATUS FOR ACCURATE CHARACTERIZATION OF SIGNAL COIL RECEIVER SENSITIVITY IN MAGNETIC RESONANCE IMAGING (MRI)

CROSS-REFERENCE TO RELATED APPLICATIONS

This application claims the benefit of U.S. Provisional Application Nos. 61/603,542 filed Feb. 27, 2012 and 61/691,040 filed Aug. 20, 2012, each of which is incorporated herein by reference in its entirety.

BACKGROUND

The present invention relates to nuclear magnetic resonance (NMR) systems and methods for measuring in vivo receiver sensitivity maps.

Accurate characterization of receiver sensitivity is necessary for performing magnetic resonance (MR), particularly fast MR imaging (parallel MR imaging) with multi-channel coils composed of a plurality of coil elements. During parallel magnetic resonance imaging, different receive coils sample different portions of the k-space concurrently. The data from each coil is transformed or "unfolded" in accordance with its sensitivity in reconstructing the final image. The accuracy of the final image depends on accurate characterization of the sensitivity of the coil. Accurate characterization of coil sensitivity is critical for correction of signal intensity inhomogeneity, and accurate and precise quantification of various parameters using MRI and MRS techniques, such as macromolecule, perfusion, and molecule concentration.

SUMMARY OF THE INVENTION

Three methods for estimating in vivo receiver sensitivity are disclosed. The electromagnetic field method is only available for estimating the receiver sensitivity of transceiver coils. The method is based on measurements of the transmit field of transceiver coils and their transverse radiofrequency field. The sensitivity of a second transceiver coil or a receive-only coil can be obtained using a reference method with the measured transceiver coil receive sensitivity. The other two methods, the bias field method and the uniform transmit field method, are based on post-processing of MR signal intensity. The bias field method includes estimations of the transmit field and bias field. Receiver sensitivity is determined using the estimated transmit field and bias field. The uniform transmit field method is realized using either transmit field shimming or combined RF pulse methods. Because transit fields are assumed to be uniform after applying either transmit field shimming or combined RF pulse, receiver sensitivity is determined by estimating the bias field of the acquired image using the uniform transmit field. These approaches can be used to reduce wrapping or aliasing artifacts in parallel MR image reconstruction, to reduce artifacts and variability in quantitative MRI, and to improve the accuracy and precision of molecule concentration estimation in quantitative MRS or MRSI.

The present invention relates to methods for mapping receiver sensitivity of RF receiver coils. More particularly, embodiments of the invention include methods and systems for:

(1) Producing a set of signal intensity images by an MR scan conducted with different imaging parameters for estimating the transmit field of a transmit coil and receiver sensitivity of a receive coil. In order to reduce scan time for estimating receiver sensitivity, in various embodiments images are acquired in low resolution using fast acquisition methods (such as segmented echo planar imaging sequences, parallel imaging acquisition, and k-space under-sampling);

(2) Estimating the relative flip angle map, and then relating the transmit field maps with the images acquired at different flip angles;

(3) Determining the calibration factor of the transmit RF field or flip angles with the assumption of a linear relationship between the nominal and measured flip angles;

(3) Calculating absolute flip angles corresponding to given nominal flip angles;

(4) Estimating the bias field of an image acquired using a given sequence with minimized TE and geometric distortion;

(5) Estimating transmit function according to Bloch's equation for a given nominal flip angle;

(6) Determining the relative receiver sensitivity for receiver coils with the ratio between the bias field of an image and the transmit function of the image.

Accordingly, in one embodiment the invention provides a method for estimating receiver sensitivity in a magnetic resonance (MR) system. The method includes steps of acquiring an image SI(x); determining a transmission function T(x) including using Bloch's equation with an estimated transmit field $B_1^{transmit}$; generating an estimate of the bias field B(x); and combining the estimated bias field B(x) and the transmission function T(x) to determine a receiver sensitivity S(x).

In another embodiment the invention provides a method for estimating receiver coil sensitivity in a magnetic resonance (MR) system. The method includes steps of acquiring an image SI(x) of a receiver coil, wherein acquiring includes obtaining the image SI(x) using various combined RF pulses and RF shimming methods, such that the image SI(x) has a uniform transmission function T(x); and estimating a bias field B(x) using the image SI(x), wherein the receiver coil sensitivity includes the estimated bias field B(x).

In still another embodiment, the invention includes a method for estimating receiver coil sensitivity in a magnetic resonance (MR) system. The method includes steps of estimating a transmit field of a transceiver coil; determining a transverse electromagnetic field $B_{xy}$ of the transceiver coil using at least one phase image; determining a receiver sensitivity of the transceiver coil using the transmit field and transverse electromagnetic field; using the transceiver coil as a reference coil for estimating a coil sensitivity of a second receiver coil; and estimating a receiver coil sensitivity using a reference method with the estimated receive sensitivity of the transceiver coil.

In yet another embodiment, the invention includes a method for estimating receiver coil sensitivity in a parallel magnetic resonance (MR) system, where the parallel MR system has a plurality of coils in a coil array including a reference coil. The method includes steps of estimating receiver coil sensitivity in each of the plurality of coils in the coil array of the parallel MR system using one of an electromagnetic field method, a bias field method, and a uniform transmit field method. Each of the plurality of coils in the coil array includes one or more of a surface coil, a volume coil, a set of coil arrays, or an antenna element of a coil array. The method further includes steps of obtaining a reference image using the reference coil; generating a measured sensitivity map using the reference coil; and for each of the plurality of coils of the coil array, calculating a receiver coil sensitivity map using a ratio of the reference image and an image received by the respective coil of the coil array, with the ratio being multiplied by the measured sensitivity map of the reference coil.

Other aspects of the invention will become apparent by consideration of the detailed description and accompanying drawings.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

Three methods for estimating in vivo MR receiver coil sensitivity are disclosed herein: an electromagnetic field method, a bias field method, and a uniform transmit field method. The electromagnetic field method is only available for estimating the receiver sensitivity of transceiver coils. The method is based on measurements of the transmit field of transceiver coils. The sensitivity of a second transceiver coil or a receive-only coil can be obtained using a reference method with the measured transceiver coil receive sensitivity. The other two methods, the bias field method and the uniform transmit field method, are based on post-processing of MR signal intensity. The bias field method includes estimations of the transmit field and bias field. Receiver sensitivity is determined using the estimated transmit field and bias field. The uniform transmit field method is realized using either transmit field shimming or combined RF pulse methods. Because transit fields are assumed to be uniform after applying either transmit field shimming or combined RF pulses, receiver sensitivity is determined by estimating the bias field of the acquired image using the uniform transmit field. These approaches can be used to reduce wrapping or aliasing artifacts in parallel MR image reconstruction, to reduce artifacts and variability in quantitative MRI, and to improve the accuracy and precision of molecule concentration estimation in quantitative MRS or MRSI.

In order to obtain a detectable NMR signal, the net magnetization of nuclear spins is rotated away from the static magnetic field. The rotation is performed using a radio frequency excitation field with the same frequency as the Larmor frequency of the nucleus. The angle through which the net magnetization is rotated is determined by the field strength of the radio frequency excitation signal and its duration. In the end of the radio frequency excitation pulse, the nuclei, in relaxing to their normal spin conditions, generate a decaying signal at the same radio frequency as that used for excitation. The NMR signal is picked up by a receive coil, amplified and processed by the NMR system to produce MR spectroscopy and/or MR images.

Before the commencement of each NMR scan, it is common practice to adjust the strength of the transmitted RF excitation field and the gain of the RF receiver to insure that the RF excitation pulses have the optimal frequency, strength and duration to evoke the desired NMR signal. However, this does not necessarily mean that the expected RF excitation field will be produced uniformly throughout the region of interest, or that the resulting NMR signals will be received uniformly from all locations in the region of interest. RF fields produced by most transmit coils loaded with a study subject are not homogeneous and the receive fields of most receive coils are similarly not homogeneous. This is particularly true of imperfect coil configurations, such as surface coils and phase array coils. Even if the transmit and receive fields are homogeneous in free space or in the unloaded condition, wave behavior and penetration of the RF field into the subject may give rise to a non-uniform transmit field and receiver sensitivity throughout the region of interest. Moreover, incorrect calibration of the RF pulse amplitude, instability or drift of the RF amplifier or other RF electronics, can lead to a non-uniform transmit field. Also, mutual inductance between transmit and receive coils may cause further inhomogeneities in the transmit field and receiver sensitivity. Either inhomogeneous transmit field or inhomogeneous receiver sensitivity or both can gives rise to ghost artifacts in signal intensity and introduce variations of MR data over time in longitudinal studies and across different sites. The variations become apparent in parallel acquisition, high field strengths, and new scanner designs such as open access scanners. Recently, quantitative MRI using internal and external references for MRI/MRS has been used to reduce such variations. However, their applications are limited by various factors, particularly by receiver sensitivity.

Parallel imaging techniques have been developed to accelerate MR data acquisition. In parallel imaging, multiple receive coils are used to accelerate data acquisition in one or more dimensions by exploiting the spatial dependency of the sensitivity of phased array coils. Parallel imaging has been shown to be successful in reducing scan time, image blur, and geometric distortions. Moreover, parallel imaging can be used to improve spatial and/or temporal resolution as well as volumetric coverage. There are several types of parallel imaging reconstruction methods. These methods can generally be divided into two categories based on how they treat the reconstruction problem: 1) SENSE-based techniques (Sensitivity Encoding) estimate coil sensitivity profiles from low-resolution calibration images, which can then be used to unwrap aliased pixels in image space using a direct inversion algorithm; and 2) autocalibrating parallel imaging-based methods, such as GRAPPA (Generalized Auto-calibrating Partially Parallel Acquisition) and ARC (Autocalibrating Reconstruction for Cartesian sampling), that calculate reconstruction weights necessary to synthesize signals from acquired data using an algorithm that does not require coil sensitivity estimates. Although both SENSE- and autocalibrating parallel imaging-based approaches have been successful in practice, accurate characterization of coil sensitivity is a prerequisite for successful application of SENSE-based techniques.

Various in vitro and in vivo methods have been proposed to estimate receiver sensitivity. The in vitro methods include the simulation method and phantom pre-scan method. The simulation method estimates the receive sensitivity based on the configuration of the receiver coil and the electromagnetic properties of the loaded subject. It is time consuming and not accurate. The phantom pre-scan method assumes that the receiver sensitivity of the loaded condition is identical to that of a uniform phantom. The method is apparently not accurate. Generally, receiver sensitivity depends on both coil configuration and properties of the loaded subject.

The in vivo methods include intensity-based methods, field-based methods, and k-space calibration methods. The intensity-based methods include the pre-scan method, the minimal contrast method (MCI), and the uniform magnetization method. In the pre-scan method, the sensitivity distributions of the respective RF receiving coils are calculated based on the assumption that the body coil has a relatively uniform sensitivity distribution, which is however only approximately true at low field strengths when the wave behavior and RF penetration of the RF magnetic field can be ignored. When the field strength is high, the assumption is no longer valid. Moreover, sometimes an MRI system may not have any body coil or volume coil, in which case the pre-scan method cannot be used to estimate receiver sensitivity. The minimal contrast image method and uniform magnetization method can estimate receiver sensitivity in vivo and greatly improve the accuracy of receiver sensitivity estimation. But these methods are limited in their practical applications, particularly in configurations involving multiple tissue types.

The field-based methods include the reciprocity principle method, the rotating-object method, and calibration based on transmit field. At low field strengths, the difference between the transmit field and receiver sensitivity for a transceiver coil is small and can be ignored because the phase is constant inside an object. The reciprocity principle works very well. In that case, quasi-static approximation (Biot-Savart's Law) can depict the transmission and reception fields very well. Thus, receiver sensitivity can be replaced with the transmit field at low field strengths for transceiver coils. Various methods have been proposed for estimating transmit fields in vivo. These methods can be categorized into MR amplitude based and MR phase based methods. MR amplitude based methods include double flip angle method, dual pulse spin echo, actual flip angle imaging, and stead state method. MR phase based methods include Bloch Siegert shift method, and phase method. However, the wavelength of the RF magnetic field in high fields becomes less than 1/10 of the size of the object. The phase distribution of the magnetic field inside the object must then be considered. The difference between the transmit field and receiver sensitivity becomes significant at high field strengths and the reciprocity principle no longer works. Replacing receiver sensitivity with transmit field will introduce significant errors in quantitative MRI and large artifacts in parallel imaging reconstruction. It is known that the measured transmit field is a left-handed circularly-polarized component of a transmit/receive coil. When the relative direction between equilibrium magnetization and the main magnetic field is reversed by either rotating the object or inverting the main magnetic field, the measured pseudo-transmit field is a right-handed circularly polarized component of the coil before rotating the object or inverting the field. The right-handed component is the receiver sensitivity of the transmit/receive coil. A receiver sensitivity map can be calculated by the ratio map $\alpha(x)$ and transmit field. The ratio map $\alpha(x)$ is the ratio between transmit field and receiver sensitivity, and is obtained in 3D spaces inside a volume coil, although obtaining $\alpha(x)$ is time consuming. This method is only applicable to transceiver coils and cannot be applied to a transceiver array coil when the RF phase and amplitude of each coil element is adjusted for each subject by RF shimming.

Coil sensitivity calibration includes auto- or self-calibrating methods. The idea is to record coil sensitivity information directly during the actual scan by adding a small number of additionally acquired fully Fourier-encoded auto-calibration lines. Direct sensitivity calibration for each image is beneficial in combination with flexible coil arrays or for imaging of uncooperative patients. Various auto-calibration methods have also been used to estimate receiver sensitivity for parallel imaging reconstruction because coil sensitivity varies slowly and smoothly over space. The auto-calibration methods also have some drawbacks, although they are very good for parallel imaging reconstruction. Receiver sensitivity is a property of the receiver coil, independent of transmit coil, acquisition sequence, and imaging parameters. Nevertheless, receiver sensitivity estimated using auto-calibration methods depends to a high degree on these factors, indicating the inaccuracy of these methods. This is because all calibration methods introduce a virtual receiver coil whose receiver sensitivity is equal to the square root of the sum of the squares of receiver sensitivity of each coil element and assume that the sensitivity of the virtual coil is uniform. In practice, this assumption is problematic, particularly at high field strengths and if the imaged object is of a large size. The errors in estimated receiver sensitivity using auto-calibration methods are not problematic for qualitative parallel image reconstruction because artifacts of reconstruction are dominated by relative receiver sensitivity. However, they are very problematic for quantitative parallel image reconstruction or quantitative MRI using internal and external references. In addition, the auto-calibration methods also require additional scan time to obtain additional reference k-space line(s).

Embodiments of the disclosed invention are used to quantitatively estimate in vivo receiver sensitivity in any coil configuration. According to various embodiments of the invention, three methods (the bias field method, uniform transmit field method, and electromagnetic method) are disclosed which can be used to achieve this and other objects of the invention.

In one embodiment, the invention provides methods which facilitate the characterization of in vivo receiver sensitivity in NMR systems. The present invention contains procedures which may be executed by the NMR system to calibrate, check, or diagnose image and signal quality. It is particularly useful in evaluating the performance of RF receiver coils used in NMR systems and how their performance is affected by the subject of the NMR scan and by each other.

In another embodiment, the invention provides an exact estimate of in vivo receiver sensitivity for improving the performance of image reconstruction in parallel imaging, particularly for SENSE-based parallel imaging.

In yet another embodiment, the invention provides an exact estimate of in vivo receiver sensitivity for improving the accuracy and precision of absolutely quantitative MRI using internal and external references. As a result, it can greatly reduce the variability of MRI acquired across sites and in longitudinal studies.

In still another embodiment, the invention provides an exact estimate of in vivo receiver sensitivity for exploration of new biomarkers (such as electric properties) for MRI. It can be applied in functional MRI, diagnosis of diseases, electromagnetic therapy, and human safety in electromagnetic environment.

In a further embodiment, the invention provides information for RF dynamic shimming by adjusting the phase and magnitude of each coil element. Signal inhomogeneity caused by receiver inhomogeneity can be partly compensated by the fact that transmit inhomogeneity is over-compensated by RF dynamic shimming, like parallel transmit. As a result, after RF dynamic shimming, the inhomogeneous signal intensities from non-object characteristics can be reduced or eliminated.

In another embodiment, the invention provides methods for correcting the influence of inhomogeneous receiver sensitivity on quantification of various MR parameters, such as signal intensity, $T_1$, and perfusion.

Based on the assumption that receiver sensitivity of coils changes slowly and smoothly in MR experiments, the sensitivity maps for unfolding can be provided by low-pass filtering. However, the peripheral portions of the image frequently show abnormal diverging data, making it difficult to obtain a smooth and stable sensitivity map.

1. Methods for Receiver Sensitivity Estimation a. The Bias Field (BF) Method for Receiver Sensitivity The definition of the bias field is given by:

$$SI(x)=B(x)\cdot I(x)+n \qquad (1)$$

where $SI(x)$ is the measured signal intensity of a corrupted image, $I(x)$ is the true intensity of the image, $B(x)$ is the corresponding bias field of the image, and n is additive noise.

The disclosed BF method for receiver sensitivity assumes that the bias field mostly results from transmit field and receiver sensitivity:

$$B(x)=S(x)\cdot T(x), \qquad (2)$$

where $S(x)$ is the receiver sensitivity, and $T(x)$ is the transmission function that is calculated using Bloch's Equation with the estimated transmit field $B_1^{transmit}$, which can be estimated using a number of methods. The methods include, without limitation, the double flip angle method, Simulated echo method, actual flip angle imaging, and steady state method, although other methods are also possible. The other contributions, such as $B_0$ inhomogeneity, chemical shift, and magnetic susceptibility artifacts, can be minimized using certain sequences with optimized imaging parameters. For example, they can be minimized using a gradient echo sequence with a very short TE.

Various methods, including the nonparametric nonuniform intensity normalization (N3) algorithm, SPM, and FSL-FM-RIB, can also be used to estimate the bias field or signal intensity inhomogeneity of acquired images. In the N3 method, bias field is estimated by sharpening the intensity histogram using Gaussian devolution. In FSL-FMRIB, estimation of the bias field is based on a hidden Markov random field model and an associated Expectation-Maximization (EM) algorithm. SPM is based on a Gaussian mixture tissue model, EM algorithm and Levenberg-Marquardt optimization. Additionally, many other algorithms for estimating bias field have been developed. In the invention, at least one algorithm is used to estimate the bias field and generate the receiver sensitivity $S(x)$. It can be obtained from the estimated $B(x)$ and $T(x)$:

$$S(x)=B(x)/T(x). \qquad (3)$$

Both transmit field and receiver sensitivity of coils changes slowly and smoothly in MR experiments. That is, there is small error between low resolution and high resolution transmit field and receiver sensitivity. Thus, receive sensitivity can be estimated using the images acquired with low resolution in order to save the scan time and cost.

The receive sensitivity is not dependent of imaging parameters, acquisition sequences, and k-space sampling strategies. Various fast acquisition techniques, such as segmented echo planar imaging sequences, parallel imaging acquisition, and k-space under-sampling can be used to reduce the scan time and cost for estimating the receive sensitivity.

b. The Uniform Transit Field Method

For a uniform transmit field, the transmit function is a constant. The relative receiver sensitivity of a coil whose transmit function is normalized to 1 is equal to its estimated bias field.

For a single channel coil or volume coil, a uniform transmit field can be obtained using one or more methods including, without limitation, parallel transmit, RF shimming, adiabatic pulses and composite RF pulses. The bias field of the images acquired with a uniform transmit field can be estimated using various methods (Belaroussi B, et al., Med Image Anal. 10:234; 2006, incorporated by reference in its entirety). The relative receiver sensitivity of the coil is equal to the estimated bias field. For multi-channel coils, the bias field of each channel can be estimated using various methods. The relative receive sensitivity of each channel is equal to the corresponding estimated bias field.

Figure 7:
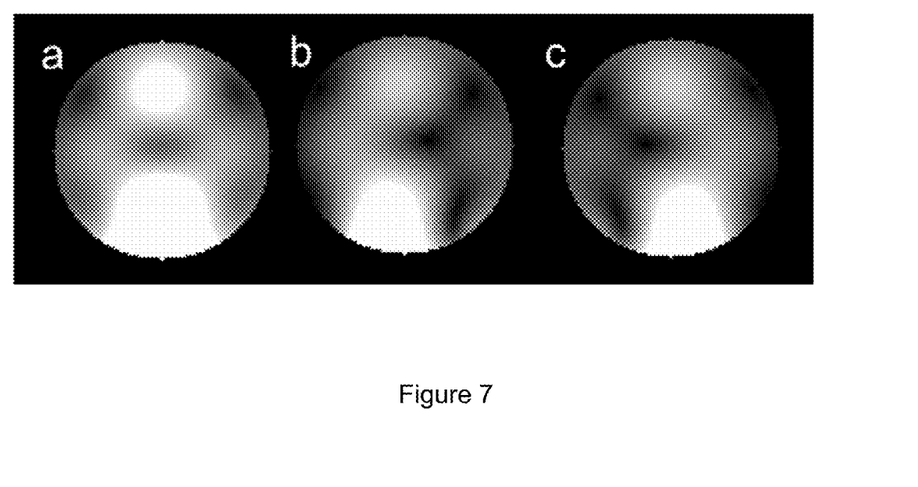
FIG. 7 shows distributions of computer simulated magnitudes of transverse RF field (a), transmit field (b), and receiver sensitivity (c) of a 10-cm diameter single-loop transceiver surface coil for a 16-cm diameter spherical phantom.
Figure 8:
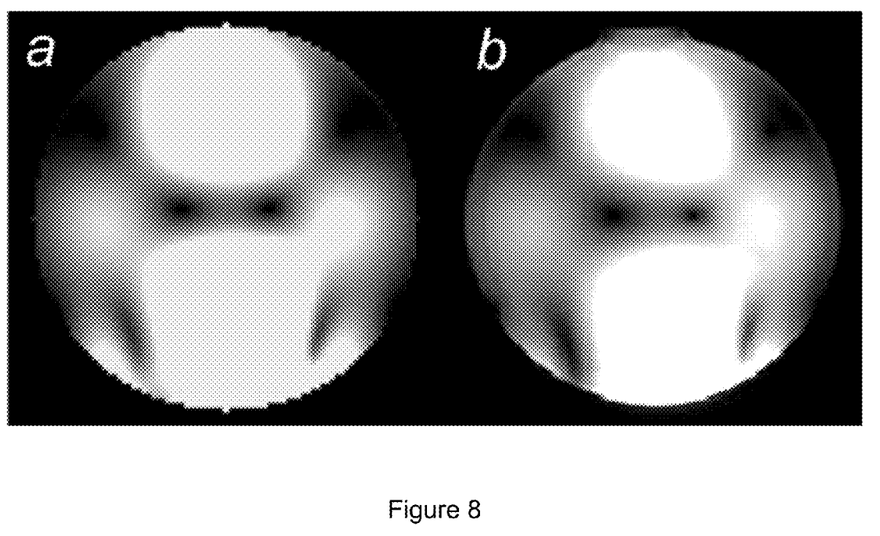
FIG. 8 shows calculated (a) and experimental (b) axial gradient echo images at the nominal flip angles of 90°, respectively.

Compared with the bias field method, the uniform transmit field method reduces the time needed to estimate the transmit field and the errors resulted from the transmit field. However, performing RF shimming requires additional time. Combined RF pulses may also introduce SAR problems. This limits its application at higher field strengths.

c. The Electromagnetic Method:

A novel method, the electromagnetic method, can be developed to estimate the receiver sensitivity of a transceiver coil, particularly for body coils. When a transceiver coil with a linear driven is used for the simultaneous transmit coil and receive coil, computer simulation (FIG. 7) and indirect MR experiment (FIG. 8) have confirmed that the transmit field $B_1^{transmit}$ and receiver sensitivity $B_1^{receive}$ has a relationship as follows:

$$|B_1^{transmit}||B_1^{receive}|=|B_x^2+B_y^2|$$

where $B_x$ and $B_y$ are component of the transceiver RF electromagnetic field along x direction and y direction, respectively. As mentioned before, the transmit field $B_1^{transmit}$ of a transceiver coil can be estimated using various methods. If a transverse electromagnetic field $B_{xy}=(B_x^2+B_y^2)^{1/2}$ of the transceiver coil can be determined, The receiver sensitivity $|B_1^{receive}|$ of the transceiver coil can be estimated using $|B_x^2+B_y^2|/|B_1^{transmit}|$.

For most efficient RF transceiver coils, for example a body coil, it follows $B_x^2+B_y^2 \gg B_z^2$. The radiofrequency field of the transceiver coil can be approximated as $B_1^2 \approx B_x^2+B_y^2$. That is, $B_x^2+B_y^2$ can be obtained from $B_1$, which can be estimated from phase images using various MRI methods (Morrell G R, Magn Reson Med. 60:889-894, 2008; Sacolick L I et. al., Magn Reson Med. 63:1315-1322, 2010, each of which is incorporated by reference in its entirety). The receiver sensitivity of any coil can be estimated using a reference method with the estimated receiver sensitivity of the transceiver coil.

For some transceiver coil configurations, for example surface coil and cardiac phased array coil, $B_x^2+B_y^2$ is comparable to $B_z^2$. $B_{xy}$ has to be estimated using special sequences and/or imaging parameters. Then the receiver sensitivity $|B_1^{receive}|$ of these transceiver coils can be estimated using $|B_x^2+B_y^2|/|B_1^{transmit}|$.

For quadrature driven transceiver coil, the relative phases of each channel used as a transmit coil are totally different from those used as a receive coil. For quadrature driven transmit coil, phase distribution will maximize the efficiency of the transmit. If this phase distribution is used for a receive, it will minimize the efficiency of receive (ideally, the efficiency of the receive is zero). But for quadrature driven receive coil, phase distribution will maximize the efficiency of the receive. If the phase is used for a transmit, it will minimize the efficiency of the transmit. Therefore, a quadrature transceiver coil used as a quadrature transmit coil is different from that used as a quadrature receive coil. That is, they should be regarded as two different coils. Only for linear drive transceiver coil, the coil used as a transmit coil is totally identical to that used as a receive coil. In this case, its receive sensitivity can be determined using the electromagnetic method mentioned above. For quadrature driven transceiver coil, it must be converted from quadrature to linear transmit mode so that receive sensitivity of the coil could be estimated using the electromagnetic field method. Various methods, such as removing a quadrature hybrid from the transceiver coil, turning off one channel of the transceiver coil, and adjusting a phase of each channel of the transceiver coil, are used to achieve this goal.

The radiofrequency transverse electromagnetic field of the transceiver coil can be obtained using dual-coil methods. The first phase image can be acquired at the on-resonance excitation of the transceiver coil. The second phase image can be acquired at the on-resonance excitation of the transceiver coil and/or off-resonance excitation of a transceiver coil being measured. The difference of the two phase images can provide the electromagnetic field of the transceiver coil being measured.

Compared with the bias field and uniform transmit field methods, the electromagnetic field method will be more accurate. It does not require extra time to get the bias field, and can reduce the error of the estimated receive sensitivity resulted from the bias field.

2. Receiver Sensitivity Estimation

Similarity metrics (SM), introduced to quantitatively describe or compare the difference between two MR images (image A and image B), is expressed mathematically as:

$$SM(x) = \frac{|SI_A(x) - SI_B(x)|}{|SI_A(x) + SI_B(x)|}, \quad (4)$$

where $SI_A(x)$ and $SI_B(x)$ are the magnitudes of images A and B at location x. As defined in Eq. (4), SM ranges from 0 to 1, with 1 indicating that image A and image B are completely different, and 0 indicating perfect match.

The coefficient of variation (CV) is used to evaluate the uniformity of MR signal intensity and estimated parameters (such as receiver sensitivity). CV is defined as $$CV = \frac{\delta}{\mu}, \quad (5)$$

where $\mu$ and $\delta$ are the mean and standard deviation of the signal or parameter.

Figure 1:
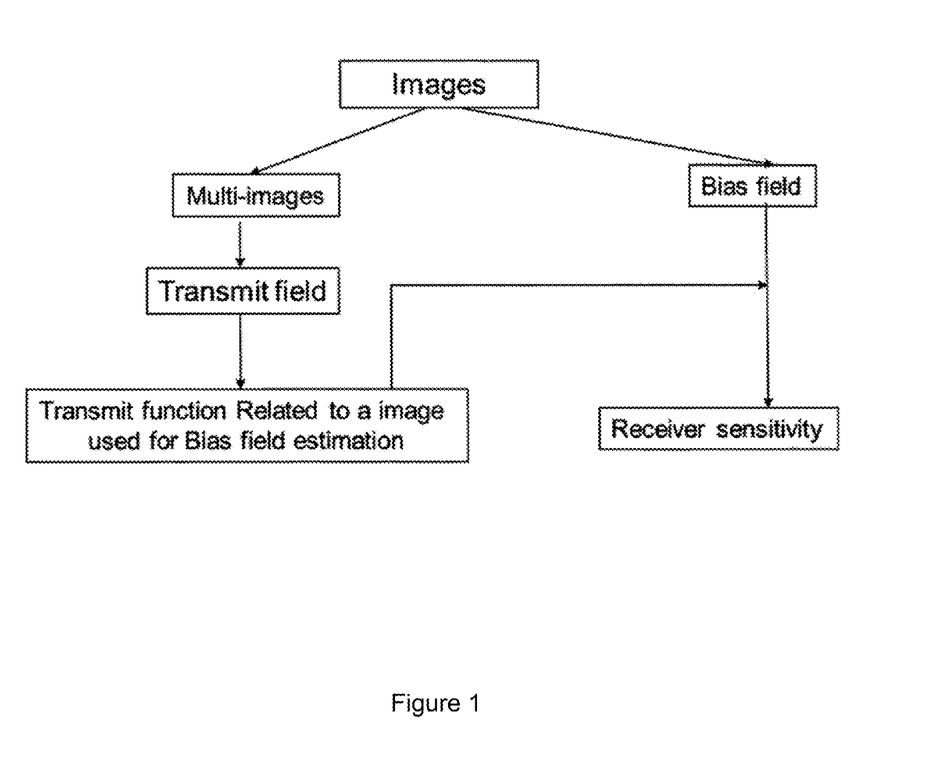
FIG. 1 is a flowchart employed in a magnetic resonance imaging system suitable for estimating in vivo receiver sensitivity using the bias field method.

FIG. 1 is a simplified flowchart employed in a magnetic resonance imaging system suitable for correcting inhomogeneous signal intensities with estimated transmit field and receiver sensitivity. The procedure includes: (1) acquire multiple images for transmit field estimation; (2) acquire an image with minimized artifacts (susceptibility artifacts and geometry distortions) using the shortest TE and other optimized parameters; (3) estimate the transmit function of the image with minimized artifacts according to Bloch's equation; (4) estimate the bias field of the image with minimized artifacts; and (5) estimate relative receiver sensitivity from the bias field and the transmit function.

Figure 2:
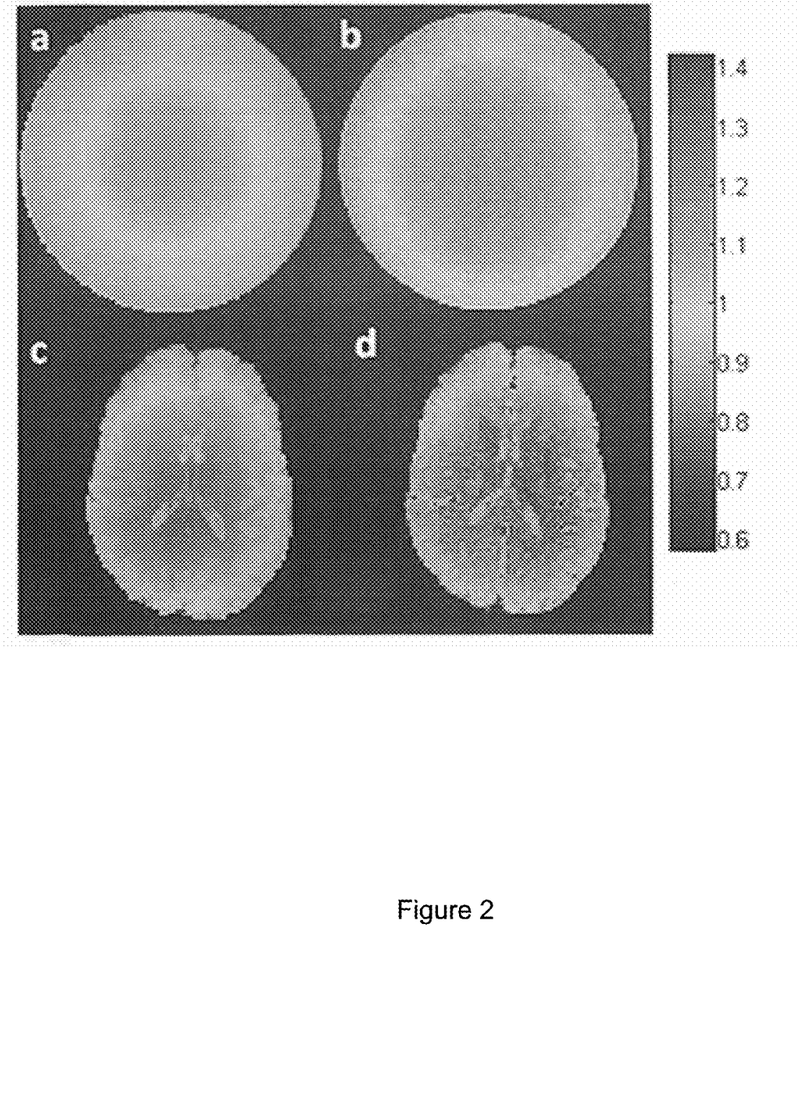
FIG. 2 shows a transmit field (a, c) and receive sensitivity (b, d) of a body coil with a uniform phantom and in vivo human brain at 3.0 T.

FIG. 2 shows the transmit field (FIGS. 2a, c) and receiver sensitivity (FIGS. 2b, d) of a body coil with a uniform phantom and an in vivo human brain at 3.0 T. Their transmit fields differ significantly from their respective receiver sensitivities. Their differences can be up to 15% for the uniform phantom, and 20% for the human brain. The estimated receiver sensitivity is noisy because the noise in the MR images is amplified during the estimation of receiver sensitivity. But low pass filtering can reduce this noise and will not affect the accuracy of the estimated receiver sensitivity. Moreover, the CV of the body coil receiver sensitivity is about 14.5% for the phantom, and 22.6% for the human brain. Thus, replacing receiver sensitivity of the body coil with its transmit field can lead to inaccurate parallel imaging reconstruction and quantitative MRI or MRS.

Figure 3:
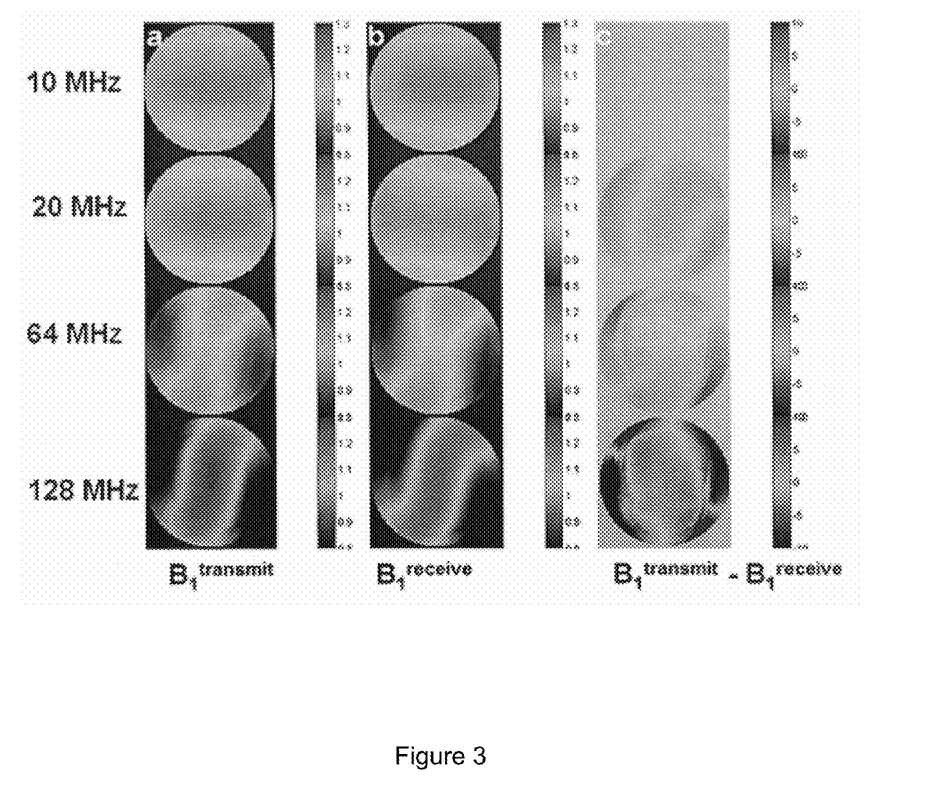
FIG. 3 shows a simulated left-handed circularly $B_1^{transmit}$ (a) and right-handed circularly $B_1^{receiver}$ (b) rotating components of $B_1$ and their difference (c) from a linear birdcage coil at 10, 20, 64, and 128 MHz.

In early MRI development, receiver sensitivity was replaced with transmit field. But FIG. 2 show that the replacement can lead to large errors at 3.0 T. In order to quantify the error, we simulated the transmit field and receiver sensitivity at different frequencies or field strengths (FIG. 3). At less than 20 MHz, the SM between the transmit field and receiver sensitivity is 0.01 and the two sensitivities can be used interchangeably. However, the SM can be more than 0.1 in some regions and become significant at Larmor frequencies greater than 20 MHz. Transmit field and receiver sensitivity cannot replace each other. This is because the definitions of transmit field and receive sensitivity are totally different in electromagnetic field theory and MRI: The relationship between electromagnetic transmitter and receiver is described using Maxwell's equations, but the relationship between MRI transmitter and receiver is described by Bloch's equation and Maxwell's equations. Both the transmit field and receiver sensitivity are $B_1$ in electromagnetic field, but they are B1transmit and B1receiver in MRI experiments. At low fields, the difference between the transmit field and receiver sensitivity for a transceiver is small and can be neglected because the phase of the magnetic field is constant inside an object. However, when the size of the object becomes larger than one-tenth of the wavelength of the magnetic field, phase distribution inside the object must be considered. In this case, if transmit field is used to replace receiver sensitivity, the maximum error can be as high as 10% in some regions of the object. Therefore, transmit field and receiver sensitivity cannot replace each other.

Figure 4:
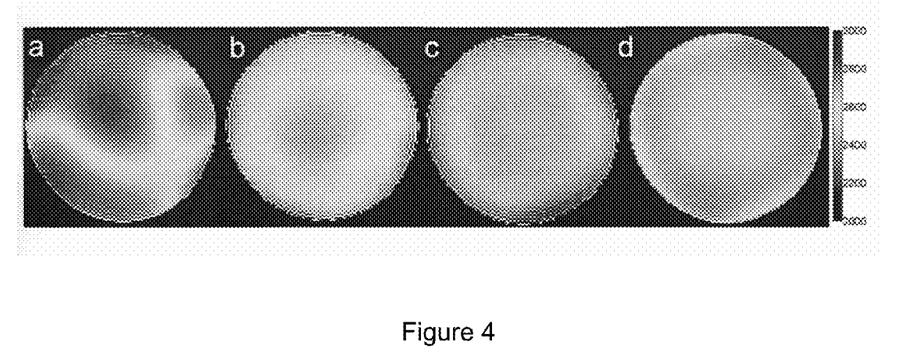
FIG. 4 shows an image of a uniform phantom (a) and corrected images using N3 (b), SPM (c), and FSL-FMRIB (d).

There is no gold standard to evaluate the quality of estimated bias field, particularly for in vivo MR images. A uniform phantom is used to evaluate the performance of several popular bias field estimation procedures. For the uniform phantom, signal intensity inhomogeneity only results from bias field. The original MR image of a uniform phantom and its corrected signal distributions using N3, SPM, and FSL-FMRIB are shown in FIG. 4. All these correction methods greatly improved the severely inhomogeneous signal intensities in the raw image. The CV of the raw image is 11.9%. The CV of the corrected image using the N3, SPM, and FSL-FMRIB are 7.3, 8.0 and 7.4%, respectively. It is noted that the mean of the corrected signal intensity using these methods is almost identical (their difference of mean is less than 3%) after signal intensity inhomogeneity corrections. Because it slightly outperformed the other methods, N3 is used to estimate bias field for determining receiver sensitivity in this invention.

Figure 5:
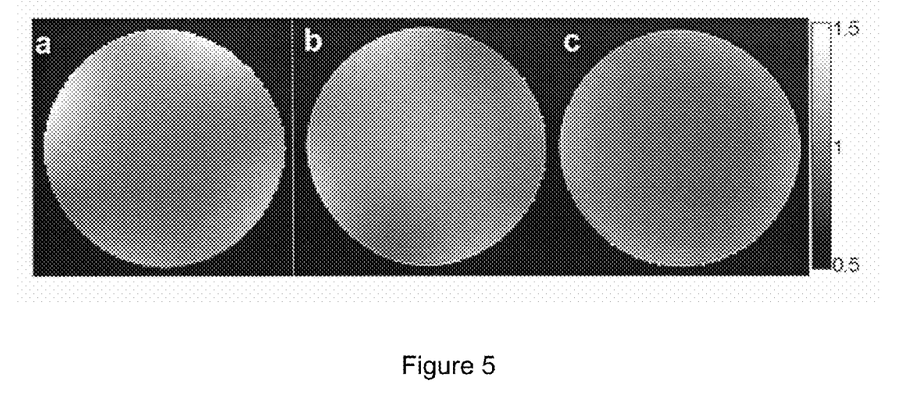
FIG. 5 Shows a receiver sensitivity of a uniform phantom using the pre-scan method (a), no contrast image method (b), and proposed BF method (c).

In FIG. 5, the receiver sensitivity of a phased-array coil for a uniform phantom is estimated using different methods. The result using the no contrast image (NCI) method is considered as the ground truth (FIG. 5a). The results from the proposed BF method and the NCI method are very similar, while higher sensitivity estimations are obtained at both the top and bottom parts of the image using the pre-scan method (FIG. 5b). The observable differences between FIGS. 5a and 5c are due to the induced artifacts at the center and boundary of the phantom when bias field is estimated using the N3 method in FIG. 4b. Commonly admitted reason for the failure of the pre-scan method is the incorrect assumption that the receiver sensitivity of a body coil is uniform. In this study, the CV of the estimated body coil receiver sensitivity is around 14.5% for the phantom (FIG. 2b).

Figure 6:
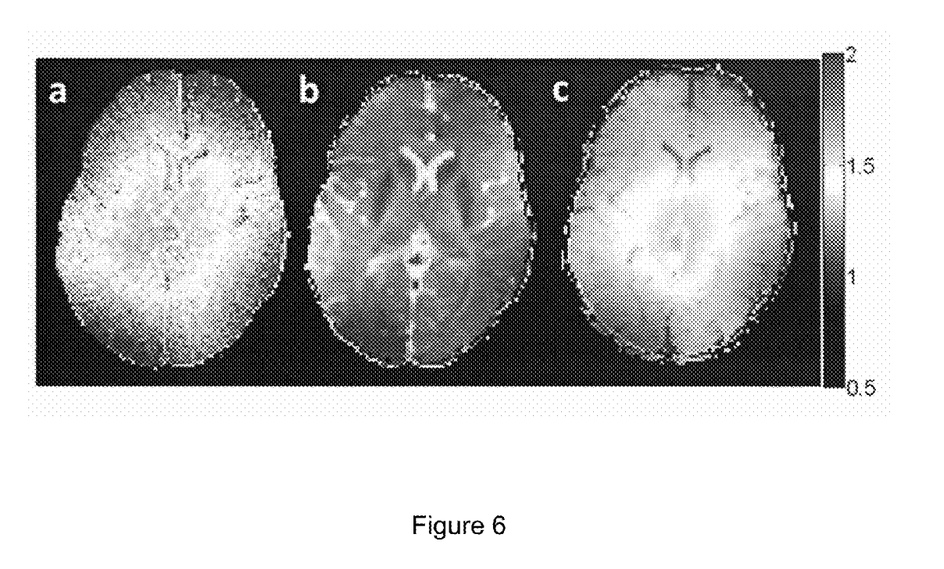
FIG. 6 shows a receiver sensitivity of a human subject using the pre-scan method (a), minimal contrast image method (b), and proposed BF method (c).

FIG. 6 shows the receiver sensitivity for a human subject using different methods. The estimated receiver sensitivity from the BF method is more similar to that of the MCI method than the pre-scan method. But it is difficult to compare the performance of the proposed BF method and the MCI method for in vivo human brain. If the region of interest (ROI) contains one or two tissue types, the MCI method has an advantage over the BF in the accuracy of estimating receiver sensitivity. But if the ROI contains more than two type tissues, the proposed BF method has advantages over MCI in terms of time efficiency and the accuracy of estimated receiver sensitivity.

The pre-scan method assumes that the receiver sensitivity of a body coil is uniform. At low field MRI or when imaging objects with low permittivity, this is a good approximation. But wave behavior becomes apparent with high field strength or high permittivity of imaged objects. The wave behavior effect will lead to big variability of receiver sensitivity of the body coil. For example, the size of the human brain, around 18 cm in diameter, is comparable to the wavelength of the RF in the brain, about 24 cm at 3.0 Tesla. As a result, coherent addition of electromagnetic waves gives rise to the maximal receiver sensitivity at the center of the brain and up to 7% non-uniformity or variability of sensitivity across the brain. Thus, the assumption that receiver sensitivity of the body coil is uniform does not hold in this case. The estimated receiver sensitivity using pre-scan method would not be accurate at high field strengths. Our quantitative analyses indicate that the CV is about 14.5% for the phantom, and 22.6% for the human brain.

The MCI method has been regarded as a unique way to estimate in vivo receiver sensitivity. However, the MCI method needs additional time to obtain the minimal contrast images. In addition, residual contrasts in the minimal contrast image can lead to errors in estimated receiver sensitivity (or residual tissue structure) as shown in FIG. 5b. Particularly in regions containing multiple tissue types and multiple pathological changes for the same tissue type, the MCI method needs more time to obtain the minimal contrast image, and the residual contrasts may increase, limiting the application of this method.

Our proposed BF method assumes that the bias field mainly results from transmit field and receiver sensitivity. The other factors, such as B0 inhomogeneity and susceptibility artifacts, can be minimized using optimized imaging parameters. For example, minimizing the TE of a gradient echo sequence can reduce the effect of B0 inhomogeneity and susceptibility artifacts on brain signal inhomogeneity. The major error of the proposed method comes from the estimation of the bias field. As shown in FIG. 2, the CV of the corrected image using N3 is still 7.3%. The SNR of the raw image is 50. The variation of signal intensity from noise should be about 2% (1/SNR). The CV of the corrected image using N3 is much higher than the variation from noise. The reason is that artifacts caused by the N3 bias field correction are around 4% at the center and 5% at the boundary of the corrected image. With improvement of the accuracy of estimated bias field, the accuracy of estimated receiver sensitivity using the proposed BF method will be greatly improved. This method offers an alternative and improved technique to estimate in vivo receiver sensitivity. It has a significant advantage over the MCI method in terms of time efficiency, and can be easily extended for any tissue and coil configurations.

The other major error of estimated receiver sensitivity using the BF method comes from the estimate of the transmit field. Since transmit field and receive sensitivity change slowly and smoothly in MRI experiments, they can be estimated using low resolution images and interpolated for MR images at higher resolution. In most cases, the errors in estimated transmit field and receiver sensitivity are smaller than those of MR images with high resolution. Thus, the effect of the error of estimated transmit field on receiver sensitivity is ignorable in practice. Another major drawback of the BF method is that it requires extra scan time for estimating transmit field. This drawback can be solved using the uniform transmit field which is generated by RF shimming and combined RF pulses (such as the adiabatic pulse and other RF pulses). In that case, the bias field of the images acquired with a uniform transmit field can be estimated using various methods, and the receiver sensitivity is equal to the estimated bias field. Compared with the bias field method, the uniform transmit field method reduces the time needed to estimate the transmit field and the errors resulted from the transmit field. However, performing RF shimming requires additional time and combined RF pulses may introduce SAR problems. These drawbacks may limit the applications of uniform transmit field in estimating receiver sensitivity at high field strengths.

FIG. 7 illustrates the distributions of computer simulated magnitudes of transverse RF field (a), transmit field (b), and receiver sensitivity (c) of a 10-cm diameter single-loop transceiver surface coil for a 16-cm diameter spherical phantom. The transverse RF field is calculated using the square root of the product of the transmit field $B_1^{transmit}$ and receiver sensitivity $B_1^{receive}$ (Collins, et al, Magn Reson Med. 47:1026-1028, 2002, incorporated by reference in its entirety). The relationship between the transmit field and receiver sensitivity is confirmed by MRI experiment at 7.0 Telsa (Collins et al, 2002; Wang et al, Magn Reson Med. 48:362-369, 2002, incorporated by reference in its entirety). It provides the basic principle for applying the electromagnetic method to estimate receiver sensitivity in this invention.

To validate and confirm the definition of transmit field and receiver sensitivity and their relationship in FIG. 7, the calculated images using the transmit field and receiver sensitivity are compared with the experimental results under the same conditions. A circular surface coil with a diameter of 10 cm was constructed of copper tape with four capacitive (4.7 pF) as a transceiver coil (Collins, et al 2002). A spherical phantom with a radius of 8 cm and containing 20 mM saline solution was used as a phantom to confirm the relationship between transmit field and receiver sensitivity of the transceiver coil. The phantom was modeled with an identical geometry, a relative permittivity of 78 and conductivity of 0.26 S/m. The conductivity of this phantom is about halfway between those of white matter and fat at 300 MHz. It was used because it produced a characteristic image intensity distribution at 7.0 T. The specific image distribution provides a stringent test of our computer modeling method and serves as an excellent example for the complexity of the RF field polarization behavior. The finite difference time domain (FDTD) numerical method for electromagnetics was used to calculate all electrical and magnetic fields throughout the model (Collins et al, 2002; Wang et al, 2002). Our methods for modeling the MR experiment with the FDTD method and then relating calculated results to the MR experiment are presented. All FDTD calculations were performed with a commercially available software package ("xfdtd"; Remcom, State College, Pa.). The details about calculation and experiments are shown in our previous publication (Collins et al, 2002; Wang et al, 2002). FIG. 8 shows calculated (a) and experimental (b) axial gradient echo images at the nominal flip angles of 90°, respectively. The flip angles for the calculated images were obtained by adjusting parameter to match the experimental image intensity distribution with 90° flip angle. Some subtle features such as the two "dark holes" near the center of the phantom in the images are exactly reproduced in the calculated images. The agreement indirectly confirms that the definition of transmit field and receiver sensitivity of the surface coil is right, and their relationship $|B_{xy}|^2 = |B_1^{transmit}| \cdot |B_1^{receive}|$ is correct. That is, the result confirms the basic principle of electromagnetic method to estimate the receiver sensitivity.

Various applications of the method and apparatus of the invention are possible:

The first application is for correcting inhomogeneous signal intensities from non-object characteristics using receiver sensitivity. MR images after correcting inhomogeneous signal intensities caused by inhomogeneous RF and inhomogeneous receive sensitivity can be used to improve accuracy and precision of tissue segmentation and classification. Accurate segmentation of magnetic resonance images is very crucial in many biomedical applications: (a) quantifying functional cortex; (b) performing quantitative analysis for diagnosis; (c) performing multimodality fusion and registration; (d) correcting partial volume effects and refine the quantitative analysis of magnetic resonance spectroscopy (MRS), PET and other parameters; (e) detecting the lesion as well as lesion volume.

The second application is for estimating absolute parameters using an internal and external reference in MRI and/or magnetic resonance spectroscopy (MRS).

Reducing scan time is a very important objective in MRI. In addition to improved patient comfort, shorter scan times can free up the imaging system for more patients and reduces image artifacts caused by patient motion. Parallel imaging techniques have been widely used in MRI and MRS. Coil sensitivity information is very important for parallel imaging reconstruction, particularly for SENSE-based parallel imaging techniques. The third application of the invention is that the obtained receiver sensitivity map is used to reconstruct images acquired with parallel imaging techniques The parallel MR system has a plurality of coils in a coil array including a reference coil, the coil sensitivity of the reference coil can be determined using at least one of bias field method, uniform field method and the electromagnetic field method. For each element of the coil array, its receiver coil sensitivity map is determined using a ratio of the reference image and an image received by the respective coil of the coil array, with the result of the division being multiplied by the measured sensitivity map of the reference coil. The obtained receive sensitivity can be used for reconstruct images acquired from each element using various algorithms such as SENSE, PARS, SMASH, and GRAPPA, and various k-space trajectories. Accurate receive sensitivity estimation can reduce the artifacts of reconstructed images, and improve the image quality.

Since the receive sensitivity strongly depend on the electrical properties a sample being imaged, the estimated receive sensitivity can be used to determine conductivity and permeability of a sample, electromagnetic field distribution inside the sample. As a result, a new biomarker about electrical properties and electromagnetic field can be provides for functional MRI, diagnosis of diseases, electromagnetic therapy, and human safety in electromagnetic environment. The fourth application is to use for a new bio marker.

The estimated receive sensitivity can be used as an input of parallel transmit techniques and/or dynamic shimming of RF field in order to eliminate inhomogeneous signal intensities caused by receiver coil.

In the electromagnetic field method, the receive sensitivity of a transceiver coil is determined based on measurements of the transmit field of transceiver coils and their transverse radiofrequency field. When the receive sensitivity and transverse electromagnetic field of the transceiver coil are measured using a reference method and phase images, the transmit field of the transceiver coil is calculated using the ratio of the measured transverse electromagnetic field and receive sensitivity.

In various embodiments, the disclosed methods may be implemented on one or more computer systems. Each computer system may be in wired or wireless communication with an MR system and/or with one another through a combination of local and global networks including the Internet. Each computer system may include one or more input device, output device, storage medium, and processor. Possible input devices include a keyboard, a computer mouse, a touch pad, a touch screen, a digital tablet, a microphone, a track ball, and the like. Output devices include a cathode-ray tube (CRT) computer monitor, a liquid-crystal display (LCD) or LED computer monitor, touch screen, speaker, and the like. Storage media include various types of local or remote memory devices such as a hard disk, RAM, flash memory, and other magnetic, optical, physical, or electronic memory devices. The processor may be any typical computer processor for performing calculations and directing other functions for performing input, output, calculation, and display of data in accordance with the disclosed methods. In various embodiments, implementation of the disclosed methods includes generating sets of instructions and data (e.g. including image data and numerical data) that are stored on one or more of the storage media and operated on by a controller.

In some embodiments, implementation of the disclosed methods may include generating one or more web pages for facilitating input, output, control, analysis, and other functions. In other embodiments, the methods may be implemented as a locally-controlled program on a local computer system which may or may not be accessible to other computer systems. In still other embodiments, implementation of the methods may include generating and/or operating modules which provide access to portable devices such as laptops, tablet computers, digitizers, digital tablets, smart phones, and other devices.

Thus, the invention provides, among other things, a method for estimating receiver sensitivity in a magnetic resonance (MR) system. Various features and advantages of the invention are set forth in the following claims.

What is claimed is:

1. A method for estimating receiver coil sensitivity in a magnetic resonance (MR) system, the method comprising:
   estimating a transmit field of a transceiver coil from signal intensity images acquired by the MR system;
   determining a transverse electromagnetic field B_xy of the transceiver coil using at least one phase image;
   determining a receiver sensitivity of the transceiver coil using the transmit field and transverse electromagnetic field;
   using the transceiver coil as a reference coil for estimating a coil sensitivity of a second receiver coil; and
   estimating a receiver coil sensitivity using a reference method with the estimated receive sensitivity of the transceiver coil.

2. The method of claim 1, wherein the transceiver coil comprises a body coil, a transceiver head coil, a coil array, or a transceiver surface coil.

3. The method of claim 1, wherein the transceiver coil used as a transmit coil is in linear driven mode.

4. The method of claim 1, wherein the transceiver coil used as a transmit coil is in quadrature driven mode, and wherein the method further comprises converting a transmit mode of the transceiver coil from quadrature to linear comprising
   removing a quadrature hybrid from the transceiver coil,
   turning off one channel of the transceiver coil, and
   adjusting a phase of each channel of the transceiver coil to convert the mode to linear.

5. The method of claim 1, wherein the transceiver coil used as a transmit coil is in quadrature driven and wherein a transmit field of the quadrature driven coil is approximated as a radiofrequency transverse electromagnetic field of the transceiver coil.

6. The method of claim 1, wherein estimating a transmit field of a linear-driven transceiver coil comprises estimating a transmit field of a transceiver coil.

7. The method of claim 1, wherein a transverse electromagnetic field B_xy of the transceiver coil with a linear driven mode is determined using at least two phase images, and wherein the at least two phase images are determined at the transceiver coil with different sets of RF pulse configurations.

8. The method of claim 7, wherein the different sets of RF pulse configurations comprise differences in at least one of a number of RF pulses, a flip angle amplitude, a flip angle duration time, an on-resonance frequency, and an off-resonance frequency.

9. The method of claim 1, wherein determining a transverse electromagnetic field B_xy of the transceiver coil with a linear driven mode using the reference coils and at least two phase images, wherein the at least two phase images are determined by
   acquiring a first phase image at an on-resonance excitation of the reference coil,
   acquiring a second phase image at the excitation of the transceiver coil and the on-resonance excitation of the reference coil with the same imaging parameters as those of the first phase image, wherein the transceiver coil is being measured,
   calculating a difference of the first phase image and the second phase image to provide the transverse electromagnetic field B_xy of the transceiver coil.

10. The method of claim 1, wherein estimating a relative flip angle map comprises estimating a relative flip angle map using a low resolution image.

11. The method of claim 1, wherein acquiring an image SI(x) comprises acquiring an image SI(x) at low resolution using fast acquisition using at least one of segmented echo planar imaging sequences, parallel imaging acquisition, and k-space under-sampling.

12. A method of operating a magnetic resonance system, comprising:
   estimating a receiver coil sensitivity using a method of claim 1;
   using the estimated receiver coil sensitivity to perform at least one of quantitative magnetic resonance imaging (MRI), quantitative magnetic resonance spectroscopy (MRS), parallel image reconstruction, parallel transmitter excitation, determining electrical properties of a sample, transmitter field estimation, and inhomogeneity signal intensity correction.

13. A method for estimating receiver coil sensitivity in a parallel magnetic resonance (MR) system, the parallel MR system having a plurality of coils in a coil array including a reference coil, the method comprising:
   estimating receiver coil sensitivity in each of the plurality of coils in the coil array of the parallel MR system using a method of claim 1, wherein each of the plurality of coils in the coil array includes one or more of a surface coil, a volume coil, a set of coil arrays, or an antenna element of a coil array;
   obtaining a reference image using the reference coil;
   generating a measured sensitivity map using the reference coil; and
   for each of the plurality of coils of the coil array, calculating a receiver coil sensitivity map using a ratio of the reference image and an image received by the respective coil of the coil array, with the ratio being multiplied by the measured sensitivity map of the reference coil.

14. The method of claim 13, wherein the receiver coil sensitivity maps and the received image data for each of the plurality of coils in the coil array are used for at least one of MRI image reconstruction algorithms and reducing artifacts in parallel image acquisition.

15. The method of claim 13, wherein parallel image acquisition is performed using at least one of SENSE, PARS, SMASH, and GRAPPA.

16. The method of claim 14, wherein parallel image acquisition signals are acquired using a k-space trajectory selected from a Cartesian trajectory and a spiral trajectory.

17. The method of claim 13, wherein an estimated receiver coil sensitivity of any of the plurality of coils is used for one of quantitative magnetic resonance imaging (MRI) or quantitative magnetic resonance spectroscopy (MRS) with an external reference or an internal reference.

18. The method of claim 13, wherein determining electrical properties of a sample comprises determining at least one of conductivity and permeability of a sample, electromagnetic field distribution inside the sample.

19. The method of claim 18, wherein determining at least one of conductivity and permeability of a sample provides a biomarker for functional MRI, diagnosis of diseases, electromagnetic therapy, and human safety in electromagnetic environment.

20. The method of claim 13, further comprising estimating a three-dimensional transmitter field of a transceiver coil, comprising
- estimating a receiver sensitivity of a body coil using method of claim 1,
- determining a receiver sensitivity of a transceiver coil using a pre-scan method with the receiver sensitivity of a body coil,
- estimating a transverse electromagnetic field using at least one phase image, and
- calculating the three-dimensional transmitter field of the transceiver coil from the transverse electromagnetic field and the receiver sensitivity.

21. The method of claim 13, further comprising reducing MR signal inhomogeneity using the estimated receiver coil sensitivity of any of the plurality of coils in the coil array with one of a parallel transmit technique, RF shimming, and a post-processing technique.

* * * * *